(12) United States Patent
Voldman

(10) Patent No.: US 6,369,994 B1
(45) Date of Patent: *Apr. 9, 2002

(54) METHOD AND APPARATUS FOR HANDLING AN ESD EVENT ON AN SOI INTEGRATED CIRCUIT

(75) Inventor: Steven H. Voldman, South Burlington, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/127,503

(22) Filed: Jul. 31, 1998

(51) Int. Cl.[7] ................................................. H02H 9/00
(52) U.S. Cl. ......................................................... 361/56
(58) Field of Search ........................... 361/56, 111, 91.1; 257/355–357

(56) References Cited

U.S. PATENT DOCUMENTS

| | | | |
|---|---|---|---|
| 4,423,431 A | 12/1983 | Sasaki | 357/41 |
| 4,819,047 A | 4/1989 | Gilfeather et al. | 357/23.13 |
| 4,989,057 A | 1/1991 | Lu | 357/23.7 |
| 5,124,877 A | 6/1992 | Graham | 361/212 |
| 5,311,391 A | 5/1994 | Dungan et al. | 361/56 |
| 5,489,792 A | 2/1996 | Hu et al. | 257/347 |
| 5,528,188 A * | 6/1996 | Au et al. | 361/56 |
| 5,567,968 A | 10/1996 | Tsuruta et al. | 257/356 |
| 5,591,992 A | 1/1997 | Leach | 257/173 |
| 5,610,790 A | 3/1997 | Staab et al. | 361/56 |
| 5,625,214 A | 4/1997 | Kinoshita et al. | 257/355 |
| 5,683,918 A | 11/1997 | Smith et al. | 437/21 |
| 5,708,288 A | 1/1998 | Quigley et al. | 257/355 |
| 5,726,844 A * | 3/1998 | Smith | 361/56 |
| 5,729,419 A | 3/1998 | Lien | 361/111 |
| 5,811,857 A * | 9/1998 | Assaderaghi et al. | 257/355 |

OTHER PUBLICATIONS

Voldman et al., CMOS–On–SOI ESD Protection Networks, EOS/ES/ESD, Symposium Proceedings, 1996, pp. 291–301, No Month.

Voldman et al., Dynamic Threshold Body–and Gate–Coupled SOI ESD Protection Networks, EOS/ESD Symposium Proceedings, 1997, pp. 210–220, No Month.

* cited by examiner

Primary Examiner—Ronald W. Leja
(74) Attorney, Agent, or Firm—Connolly Bove Lodge & Hutz; Eugene I. Shkurko, Esq.

(57) ABSTRACT

A method and apparatus for handling an electrostatic discharge (ESD) pulse in silicon on insulator (SOI) integrated circuits is provided. An ESD pulse is conducted via an ESD protection circuit from a pad to a rail or node. A discriminator means coupled to the rail or node determines when an ESD pulse has occurred and generates a signal in response thereto. The signal from the discriminator means is applied to a body bias circuit.

28 Claims, 12 Drawing Sheets

I/O Body Control System where
Body signal applied to I/O Logic Control

Specific Embodiment

Body/Gate Logic
Applied to Receiver Elements

Body & Gate Logic to Core/Core Clamp Elements

Specific Embodiment

METHOD AND APPARATUS FOR HANDLING AN ESD EVENT ON AN SOI INTEGRATED CIRCUIT

DESCRIPTION

Technical Field

The present invention relates generally to the field of electrostatic discharge (ESD) protection in silicon on insulator (SOI) integrated circuits. The present invention utilizes the "floating body" of SOI devices to enhance circuit performance and ESD robustness.

BACKGROUND OF THE INVENTION

MOSFET scaling on bulk silicon has been the primary focus of the semiconductor and microelectronic industry for achieving CMOS chip performance and density objectives. The shrinking of MOSFET dimensions for high density, low power and enhanced performance requires reduced power-supply voltages. Because power consumption, is a function of capacitance, power supply voltage, and transition frequency, the focus has been on reducing both capacitance and power supply voltage as the transition frequency increases. The components of the MOSFET capacitance consist of diffusion and gate capacitances. As a result, dielectric thickness and channel length are scaled with power-supply voltage. Power-supply reduction continues to be the trend for future low-voltage CMOS.

However, with power-supply reduction, transistor performance is severely impacted by both junction capacitance and the MOSFET body effect at lower voltages. As transistors continue to become smaller, short-channel effects (SCE) control, gate resistance, channel profiling and other barriers become an issue for advanced CMOS technologies. While significant success has been achieved with successive scaling of bulk CMOS technology, the manufacturing control issues and power consumption will become more difficult to deal with.

Using silicon-on-insulator (SOI) substrates, many concerns and obstacles of bulk-silicon CMOS can be eliminated at low power-supply voltages. CMOS-on-SOI has significant advantages over bulk CMOS technology and will achieve the scaling objectives of low power and high performance for future technologies. CMOS-on-SOI provides low power consumption, low leakage current, low capacitance diode structures, good sub-threshold I-V characteristics (better than 60 mV/decade), a low soft error rate, good SRAM access times, and other technology benefits.

SOI MOSFETs, in functional and ESD applications, are significantly different from standard bulk MOSFET structures. SOI transistor operation is dependent on the state of the SOI MOSFET "body". The voltage potential of the SOI MOSFET body is dependent on the applied voltages of the gate, drain, substrate, source and the prior potential of the body. When voltages are applied to the gate, drain and source, competition between the competing capacitive elements from previous gate-to-body, drain-to-body, source-to-body, body-to-substrate, gate-to-drain and gate-to-source capacitances will determine the eventual potential of the body. The potential of the body modulates the threshold voltage of the transistor and influences the voltage needed on the gate to invert the surface and turn on the transistor. Forward biasing also occurs when the body voltage exceeds the source or drain voltage.

The "body effect" in SOI is the modulation of the threshold voltage as a function of the body voltage. For a negative applied voltage on the body of an n-channel device, the threshold voltage increases. Allowing forward-biasing of the body-source junction, the threshold voltage drops. When the body voltage is biased positive, a "reverse body effect" occurs where the MOSFET threshold voltage decreases.

The technique of body-coupling is used in standard SOI circuits to create a "dynamic threshold" (DTMOS) device. In a DTMOS device, the body and gate are coupled. Examples of DTMOS devices are illustrated in FIG. 4 as p- and n-channel transistors 33,34. As the DTMOS gate and body voltage increases, the threshold voltage decreases. DTMOS transistors have a high transconductance and saturation current at a lower power supply voltage compared to standard SOI MOSFETSs. DTMOS devices inherently have a bipolar transistor integrated into the structure. The body contact serves as a base of the lateral npn formed by the SOI transistor. When the body voltage exceeds the emitter base voltage, the DTMOS transistor can be placed in bipolar forward active mode. DTMOS devices are suitable for both functional and ESD applications because there are no "floating body" problems, no kink effect issues and no threshold stability concerns.

To achieve low leakage, an ideal MOSFET should have a high threshold when the device is "off" (Vgs=0 V). To achieve high performance, an ideal MOSFET should have a low threshold voltage when the device is "on" (Vgs=Vdd). DTMOS provides both ideal characteristics; this advantage allows DTMOS to be extendable to ultra low sub-0.6 V power supply because of the low leakage at zero gate bias. DTMOS also has an the advantage of an ideal subthreshold characteristic of 60 mV/decade. In summary, DTMOS transistors provides improved subthreshold slope of 60 mv/decade, higher mobility, higher current drive in a low- and high-current regime, and can extend the power supply voltage to 0.6 V and below.

There is growing interest in the advanced semiconductor technology industry for electrostatic discharge (ESD) protection of CMOS-on-SOI technology. SOI ESD robustness interests will peak as the migration from bulk CMOS to CMOS-on-SOI becomes a reality and achieving industry-acceptable ESD results becomes mandatory.

Initially, in bulk silicon, a grounded gate transistor was used for ESD protection. This device is unstable as its breakdown voltage characteristic has a snap back voltage. Additionally, devices of this type are subject to second breakdown, that is an uncontrolled thermal breakdown of the device.

U.S. Pat. No. 4,423,431 to Sasaki introduced the idea of using a gate-coupled transistor as an ESD protection device. In Sasaki a protective transistor is connected between a gate of a protected internal transistor and ground. A gate of a protective transistor is connected to an input terminal. Thus, when an abnormal voltage occurs at the input terminal, the protective transistor turns on permitting the charges to be passed to ground.

Many devices and methods for providing ESD protection have been proposed for SOI. For example, U.S. Pat. No. 5,610,790 to Staab et al. teaches conducting an overvoltage from the input pad to a first voltage power rail. The overvoltage is then conducted through a cross power supply clamp to a second voltage rail. U.S. Pat. No. 4,989,057 to Lu discloses a transistor having a floating body which is used as an ESD protection circuit. However, because of the floating body, the breakdown voltage characteristic of this ESD device has a snap-back voltage and suffers from the same disadvantages as the grounded gate devices.

SOI ESD protection networks have already made considerable progress in achieving industry acceptable ESD protection levels. "CMOS-on-SOI ESD Protection Networks" by Voldman et al., pp. 291–301 EOS/ES/ESD, Symposium Proceedings, October 1996, describes recent advances.

From an ESD perspective, DTMOS has significant natural advantages. In DTMOS, with the gate and body connected, the gate-to-body voltage is zero, reducing the voltage stress across the dielectric. A DTMOS transistor has three terminals: the interconnected body and gate, the source, and the drain. Gate-coupled networks achieve superior ESD robustness in comparison to non-coupled networks because gate-coupled networks improve the current distribution and uniformity in multi-finger MOSFETs. Applying gate-coupling to DTMOS devices, body- and gate-coupling improvements can be realized. Conceptually, the rise in the body voltage acts as a feedback or trigger to lower the threshold voltage, which allows the gate coupling to trigger at a lower applied voltage. Gate-coupled DTMOS thus has the advantage of early turn-on, a higher current drive, uniform current distribution, and a high ESD metric. DTMOS can be used in bias networks, RC networks, or others to provide ESD robust circuit networks.

Recently, the SOI body/gate-coupled "diode" and its use in SOI ESD protection circuits was introduced by S. Voldman et al. in "Dynamic Threshold Body- and Gate-Coupled SOI ESD Protection Networks," pp. 210–220, EOS/ESD Symposium Proceedings 1997, which is incorporated herein by reference. A body- and gate-coupled (B/G-C) DTMOS "diode" has two terminals; the body, gate and drain of a MOSFET structure are connected as one electrode and the source as the second electrode. FIG. 3 illustrates n- and p-channel B/G-C SOI diodes 21,22. The B/G-C SOI diode has both diodic and DTMOS modes of operation. The B/G-C SOI diode can conceptually be thought of as a DTMOS device in parallel with a diode element. When the node that is connected to the drain, gate, and body increases positively, the gate and body voltage also increase. Concurrently, the body voltage increases causing a decreasing MOSFET threshold voltage, allowing for early turn-on of the MOSFET. Additionally, when the pad voltage rises above the body-to-source voltage, the body diode forward biases. The B/G-C DTMOS SOI diode has more current drive than the standard SOI diode because of the body-coupling and base-drive initiated in the parasitic bipolar transistor. In both the high-and low-current regimes, a body- and gate-coupled MOSFET has more current drive than a standard SOI MOSFET and a SOI MOSFET in a diode configuration. The B/G-C SOI diode differs significantly in its ESD operation compared to an SOI poly-bounded diode (SOI Lubistors) and a diode designed from SOI MOSFET transistors. There are several means of conduction in this SOI B/G-C DTMOS double-diode ESD network. There is a diode formed between each power supply and the pad; there is an n- and p-channel DTMOS; and there are npn and pnp bipolar elements. The advantage of the B/G-C SOI diode is that it uses both the diode action and the dynamic threshold voltage MOSFET action.

SUMMARY OF THE INVENTION

An apparatus and method for handling an ESD pulse which occurs on an SOI integrated circuit is provided. The present invention takes advantage of the fact that in SOI integrated circuits there is no true substrate and the bodies of the transistors are independent from each other. Therefore logic signals can be applied to the bodies of the individual transistors. A pad subject to an ESD pulse is coupled to a discriminating means. The discriminating means generates a signal when an ESD pulse occurs and the signal is provided to a body bias circuit.

According to one embodiment of the invention, an ESD protection circuit, which is connected to a rail, is connected in between the pad and the discriminating means. The ESD protection circuit is connected to the pad and the rail is connected to the discriminating means. The body bias circuit in this embodiment may be a driver which is coupled between the rail and ground. When an ESD pulse occurs on the pad, it is passed via the ESD protection circuit to the rail. The signal from the discriminating means is then applied to a body bias circuit which turns on, discharging the pad and rail to ground.

According to another embodiment of the invention, the pad is coupled to at least one device which is sensitive to an overvoltage event. A node is arranged between the pad and the at least one device. An ESD protection circuit is coupled between the node and a first power rail. The discriminating means is connected to the first power rail. When an ESD pulse occurs, a signal is sent from the discriminating means to at least the body of a body-biased core clamp. The core clamp is connected between a second power rail and ground.

According to another aspect of the present invention, current is conducted from a pad of an SOI integrated circuit to a discriminating means. The discriminating means determines when an ESD pulse occurs and applies a signal to at least a body of a transistor producing a change in a threshold voltage of the transistor.

BRIEF DESCRIPTION OF THE DRAWINGS

The present invention will now be further described in the following pages of the specification, when taken in conjunction with the attached drawings, in which.

DETAILED DESCRIPTION OF THE INVENTION

Figure 1:
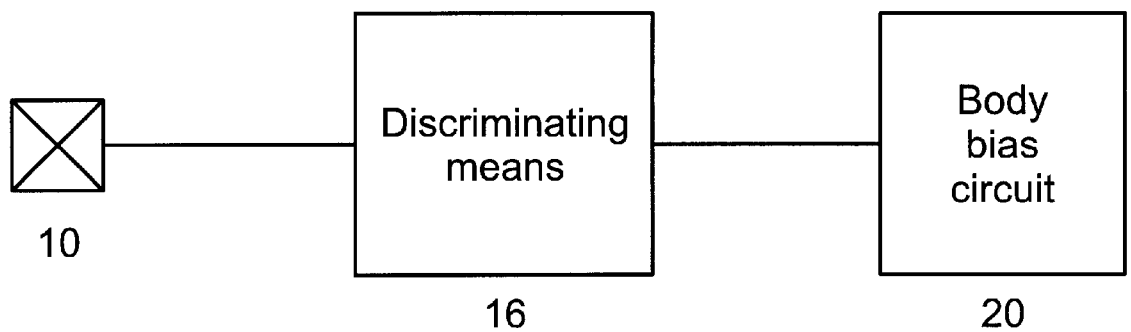
FIG. 1 is a block diagram of one embodiment of the present invention.

The present invention provides an apparatus and a method for handling an ESD pulse which occurs on a SOI integrated circuit. FIG. 1 illustrates an SOI integrated circuit in accordance with an embodiment of the present invention. The circuit includes an electrically conductive pad 10 which is subject to an ESD pulse. A discriminating means 16, coupled to the pad 10, determines when an ESD pulse has occurred and generates a signal in response thereto. The discriminating means 16 may comprise an RC filter, inverters, transient discriminators, or any other appropriate logic. A body bias circuit 20 receives the signal generated by the discriminating means 16. The term body bias circuit refers to any circuit, the components of which have a body, i.e., a substrate, which can be biased independently of the other components in the circuit. Most likely, the signal from the discriminating means will be applied to the body, the gate, or both the body and gate of a transistor in the body bias circuit.

When an ESD pulse occurs on the pad 10, the discriminating means 16, in response to the ESD pulse, provides a signal to the body bias circuit 20. The signal is preferably applied to at least the body of the body bias circuit 20 to change the voltage threshold of the body bias circuit and, if the signal is strong enough, turn the circuit on. For example, when a positive ESD pulse occurs in the SOI circuit, a "hi" signal is generated by the discriminating means 16. The "hi" signal is applied to the gate and body of an N-channel transistor to turn the transistor ON. Of course, the "hi" signal could be inverted and supplied to the body and gate of a P-channel transistor to turn it ON. Alternatively, a "hi" signal could be sent to a P-channel transistor and a "lo" signal to an N-channel transistor, if it were desired to keep the transistors off. By applying the signal from the discriminating means to both the body and gate of a transistor, several advantages are obtained. These include lowering the threshold voltage and obtaining full current drive when Vt goes to zero. Additionally, the body-gate coupling arrangement turns the transistor on faster.

One advantage of the present invention is to improve the ESD robustness of SOI integrated circuits. This is achieved by turning on the driver and/or receiver circuits to prevent SOI MOSFET second breakdown. An ESD pulse is discharged either directly to the power rail or to an SOI body discharge rail. The rail is coupled to the discriminating means which provides its signal to the driver and/or receiver circuit. The transistors of the driver and/or receiver are turned on and, in effect, shunt the ESD pulse to ground. This embodiment both prevents the second breakdown of the I/O and utilizes the I/O circuits for discharging the ESD current sent to the power rail or the SOI body discharge rail to ground.

Figure 2:
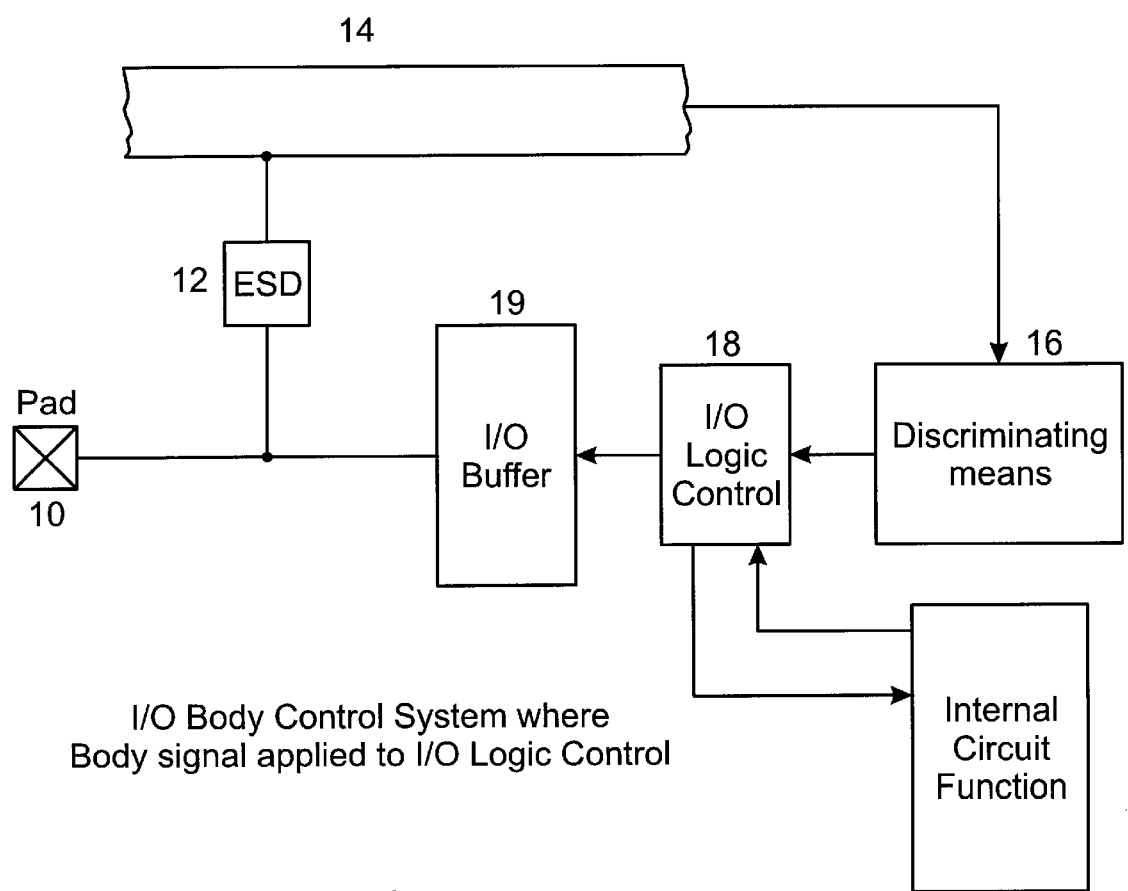
FIG. 2 is a block diagram of another embodiment of the present invention.

FIG. 2 illustrates a block diagram of a circuit for improving the ESD robustness of an SOI integrated circuit as described above. Pad 10 is now connected to an ESD protection circuit 12. The ESD protection circuit 12 may be a diode, a Lubistor, a body and gate coupled SOI diode, or other various implementations. The pad 10 and the ESD circuit 12 are also connected to an I/O buffer 19 which may be, for example, the last stage of a driver. The ESD protection circuit 12 is connected to the discriminating means 16 by a rail 14, which may be either a power rail or an SOI body discharge rail. The discriminating means 16 feeds its signal into an I/O logic control circuit 18, for example, a predrive circuit, which then feeds the I/O buffer 19. The I/O logic control circuit 18 is also used to communicate with the internal circuit function 5.

Figure 3:
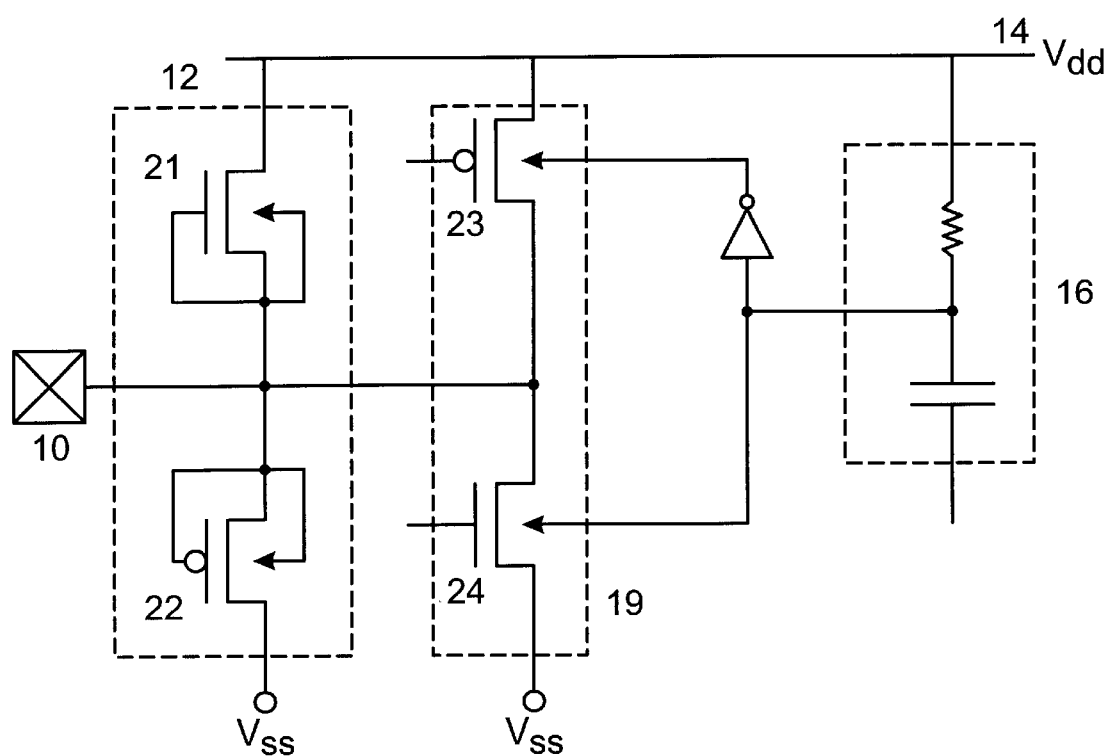
FIG. 3 is a schematic diagram of one form the embodiment of FIG. 2 showing a body coupled circuit.

Referring now to FIG. 3, a specific embodiment of the block diagram of FIG. 2 is illustrated. In this embodiment, the ESD protection circuit 12 is shown as a n-channel body and gate-coupled SOI diode 21 connected between the pad 10 and the rail 14 and a p-channel body and gate-coupled SOI diode 22 connected between the pad 10 and ground. The operation and structure of an ESD protection circuit of this type is described in co-pending application IBM Docket No. BU9-97-158V by the same inventor and is incorporated herein by reference. However, as mentioned above, any ESD protection circuit may be used.

The I/O buffer 19 is a p-channel transistor 23 connected between the pad 10 and the rail 14 and an n-channel transistor 24 connected between the pad 10 and ground. When a positive ESD pulse, with respect to the rail 14, occurs on the pad 10, the current is discharged to the rail 14 via the n-channel SOI diode 21. If the signal on the rail has the frequency of an ESD pulse, the discriminating means 16, which is shown as an RC filter in this embodiment, generates a "hi" signal. This signal is applied directly to the body of the n-channel transistor 24. The signal is inverted and then applied to the body of the p-channel transistor 23. In this way, both of the transistors 23, 24 comprising the I/O buffer have their voltage thresholds changed to turn on each of the transistors 23, 24. The turn on of the n- and p-channel transistors 24, 23 allows the current at the pad 10 and the rail 14 to discharge to the ground plane when an ESD pulse occurs. When the discriminating means 16 does not detect an ESD pulse, it pulls the body of p-channel transistor 23 high and the body of n-channel transistor 24 low, allowing normal operation of the driver.

Figure 4:
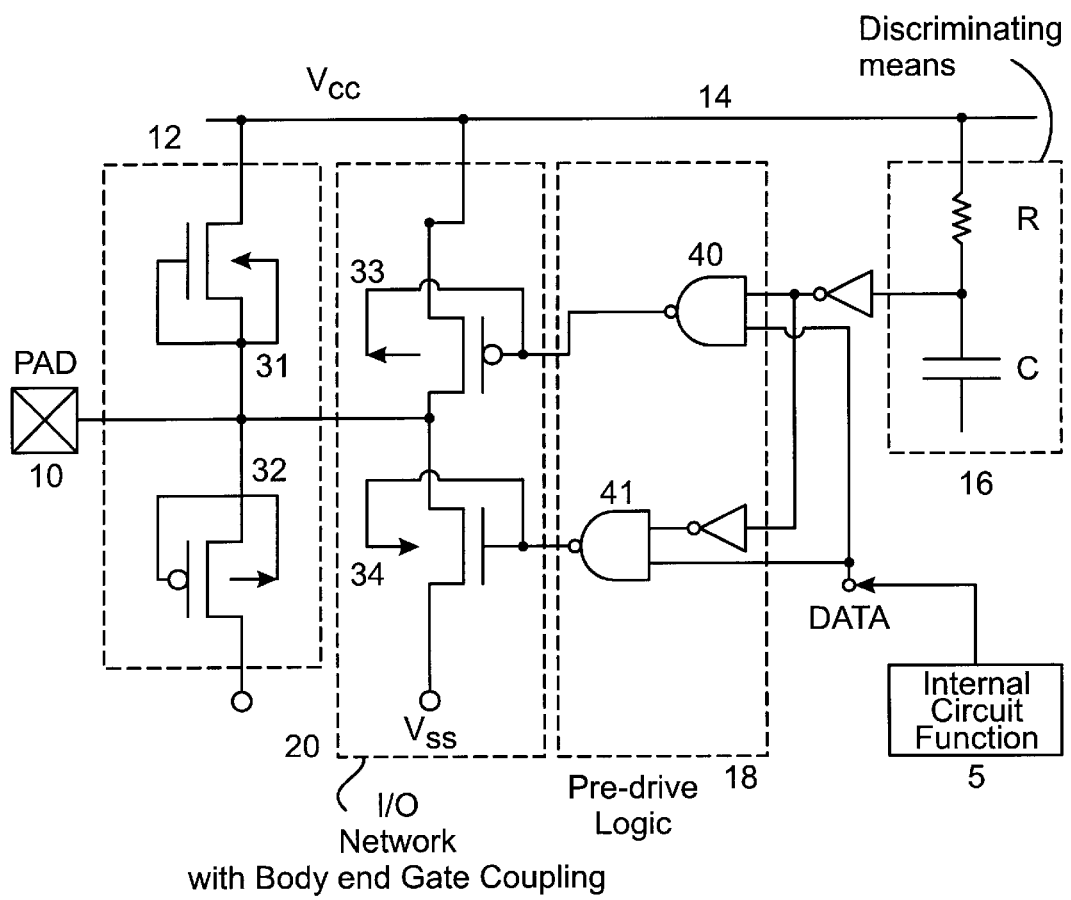
FIG. 4 is another form the embodiment of FIG. 2 showing body and gate coupling.

Another embodiment of the present invention in which the I/O network is body and gate-coupled is shown in FIG. 4. This embodiment is substantially the same as the embodiment illustrated in FIG. 3 except that the signal from the discriminating means 16 is applied to the gate, in addition to the body, of the transistors comprising the driver. In order to do this, additional logic elements are added to the existing I/O logic control circuit or predrive circuit to feed the signal from the discriminating means 16 to the driver in parallel with a data signal. Here, the signal from the discriminating means 16 and the data signal from the internal circuit function 5 are passed through nor gate 40 to the gate and body of the p-channel transistor 33 and through nand gate 41 to the body and gate of the n-channel transistor 34. This embodiment operates in substantially the same manner as the embodiment shown in FIG. 3.

When an ESD pulse occurs, it is passed via the ESD protection circuit 12 to the rail 14. The discriminating means 16 determines that an ESD pulse has occurred and supplies a signal to the I/O logic control circuit 18, which then pulls the body and gate of the n-channel transistor 34 high and the body and gate of the p-channel transistor 33 low. Both of the transistors are turned on and the pad 10 and rail 14 are discharged to ground. By applying the signal from the discriminating means 16 to both the body and the gate of the transistors 33, 34, the transistors 33, 34 are turned on faster providing better ESD protection and achieving the other advantages of DTMOS devices.

Figure 5:
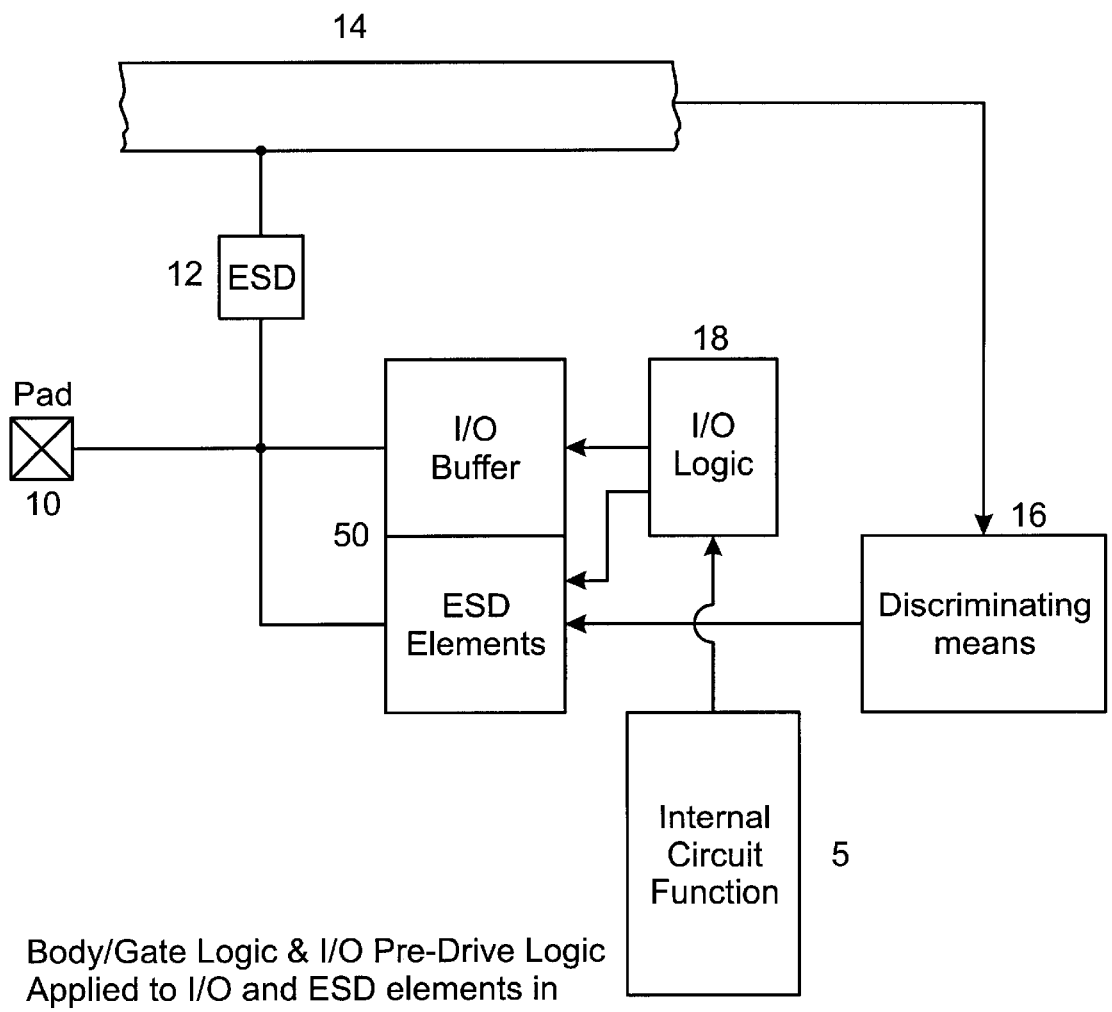
FIG. 5 is a block diagram of another embodiment of the present invention.

FIG. 5 illustrates a block diagram of an embodiment of the present invention in which the signal from the discriminating means 16 and the signal from the I/O logic control circuit 18 are applied to an I/O buffer and ESD elements in parallel. This implementation is useful, for example, in a gate array or when the transistors of the driver are 1,000 microns wide and only 500 microns are used, for example, as the n-channel pull down transistor. The other 500 microns of the n-channel transistor could then be used as an ESD element. Therefore, FIG. 5 shows the I/O buffer and ESD elements as part of the same box 50. The transistors in the I/O buffer are driven in a known manner. The transistors of the ESD elements have their bodies connected to the signal from the discriminating means 16. In essence, this separates the driven and undriven parts of the circuit so that, for example, a delay stage could be used with the ESD elements whereas this may not be desired for the I/O buffer.

Figure 6:
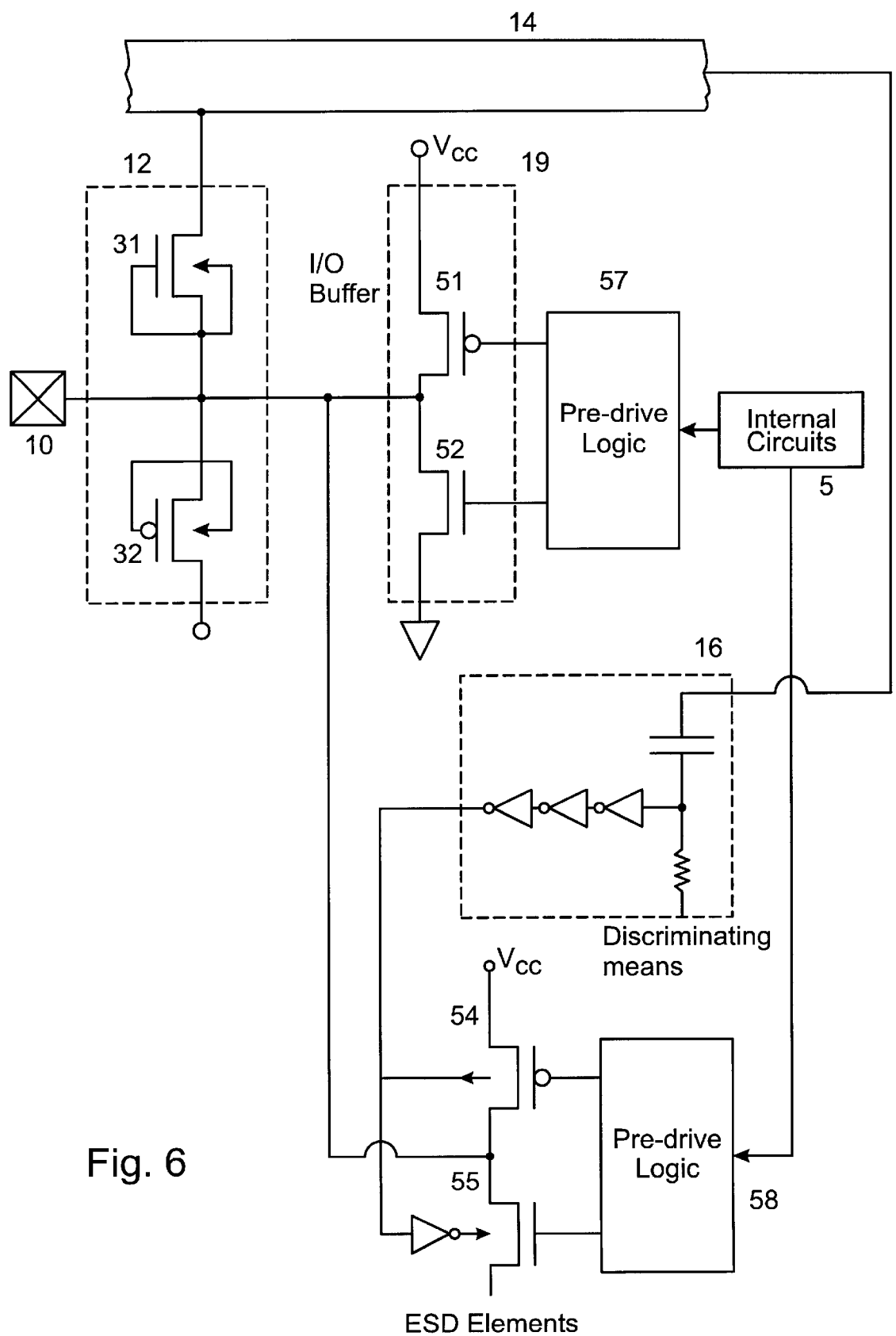
FIG. 6 is a specific form that the embodiment of FIG. 5 may take.

FIG. 6 illustrates a specific embodiment of the block diagram shown in FIG. 5.

The pad 10 is connected to ESD circuit 12 which is shown as body and gate-coupled SOI diodes 31,32. The ESD protection circuit 12 is connected to a rail 14 which feeds into the discriminating means 16. The I/O buffer 19 is shown as a known buffer with a p-channel pull-up transistor 51 and an n-channel pull-down transistor 52. In this embodiment, preferably two predrive logic circuits 57, 58, corresponding to the I/O logic control circuit 18, are provided. The first predrive logic circuit 57 drives the gates of the transistors 51, 52 in the I/O buffer 19 and the second predrive circuit 58 drives the gates of the transistors 54, 55 comprising the ESD elements. One advantage of this arrangement is that the driven gate logic is not interfered with by the ESD elements. The signal from the discriminating means 16 is applied to the body of the transistors 54,55 comprising the ESD elements, for example, a "1" to the N-channel transistor and a "0" to the P-channel transistor. This circuit operates in a manner similar to the embodiments described above in that the voltage thresholds of the ESD elements are changed to turn them ON.

Thus far, the invention has been described primarily with reference to drivers. However, the concept of the invention is equally applicable to receiver circuits or any I/O circuit where it is useful to pull the body and/or gate of the transistor high. Moreover, the invention is equally applicable to negative ESD pulses and where it is desired to pull the body and/or gate low.

Figure 7:
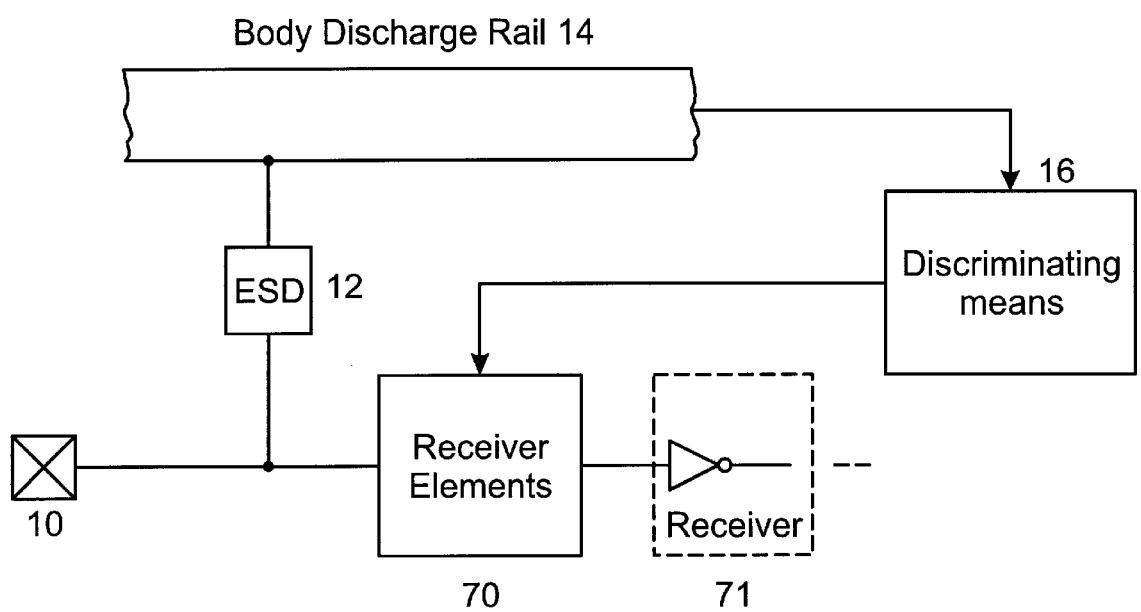
FIG. 7 is a block diagram of another embodiment of the present invention.

FIG. 7 shows an embodiment of the present invention, in block diagram, utilizing receiver elements. Pad 10, ESD protection circuit 12, rail 14, and discriminating means 16 are provided and connected in a manner similar to that described in reference to the above-described embodiments. The signal from the discriminating means 16, in this embodiment, is applied to receiver elements 70. In some cases, the receiver elements 70 may be considered an ESD element or it may be considered as part of the receiver 71. In either instance, the concept and operation of this embodiment is the same.

Figure 8:
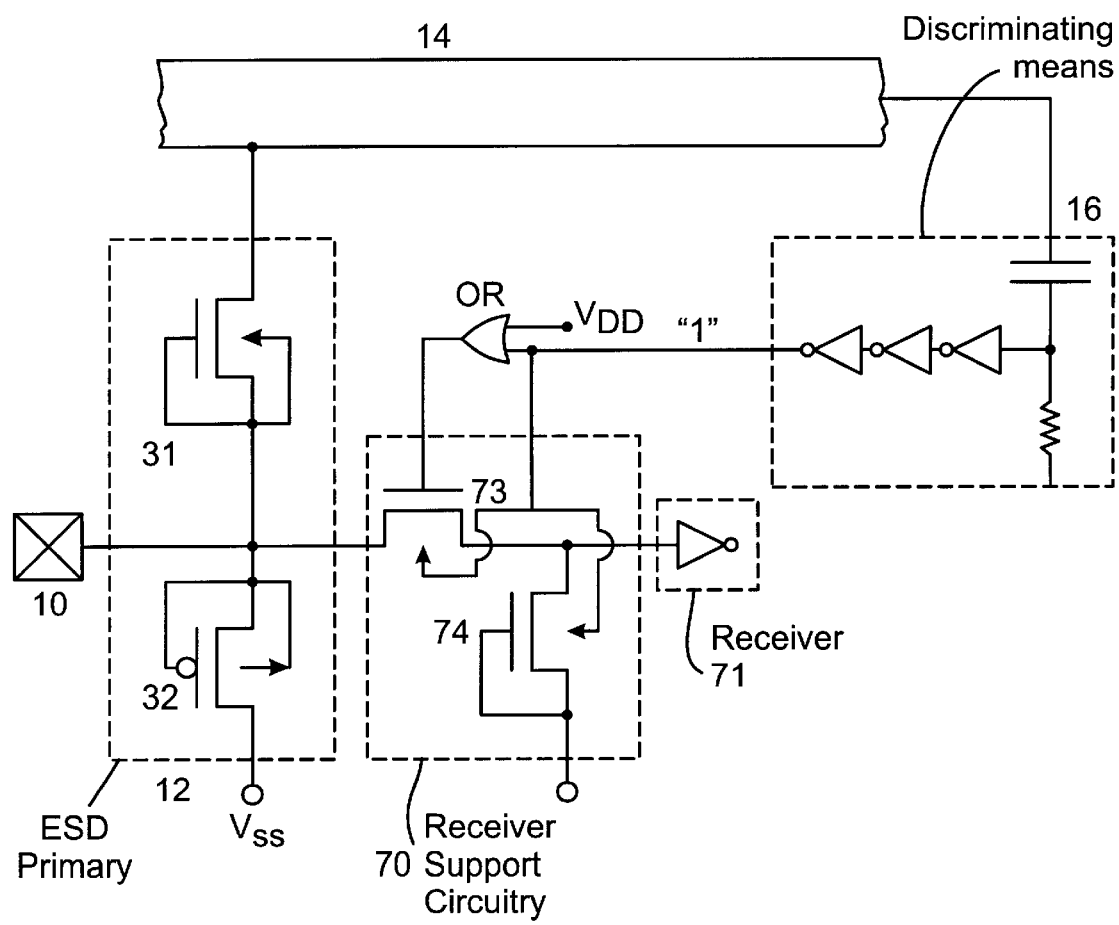
FIG. 8 is a schematic diagram of one form the embodiment of FIG. 7.

FIG. 8 shows a specific embodiment of the present invention as applied to receiver elements. The pad 10, ESD protection circuit 12, rail 14 and discriminating means 16 are again present in this embodiment and connected as described above. The ESD protection circuit 12 is shown as an SOI diode configuration comprising n-channel transistors 31,32. Again, any number of alternative ESD protection circuits are available as described above. Here, the receiver support circuitry 70 comprises an n-channel pass transistor 73 which is used to drop the voltage into the receiver 71 so that the receiver 71 receives less voltage. The body of the n-channel pass transistor 73 is connected to the signal from the discriminating means 16. When an ESD pulse occurs on the pad 10, the discriminating means 16 sends a "hi" signal to the body of the n-channel pass transistor 73. This signal lowers the threshold voltage of the transistor 73 to help turn the transistor on. Additionally, substantially concurrently, the signal from the discriminating means 16 is provided to the body of grounded gate transistor 74. Again, the signal drops the threshold voltage of transistor 74 to help turn transistor 74 on. In this way, when an ESD pulse occurs, transistors 73, 74 turn on faster, the receiver 71 is protected and does not fail. This embodiment illustrates only one receiver implementation, and many various receiver implementations which utilize the concept of the present invention are possible.

Figure 9:
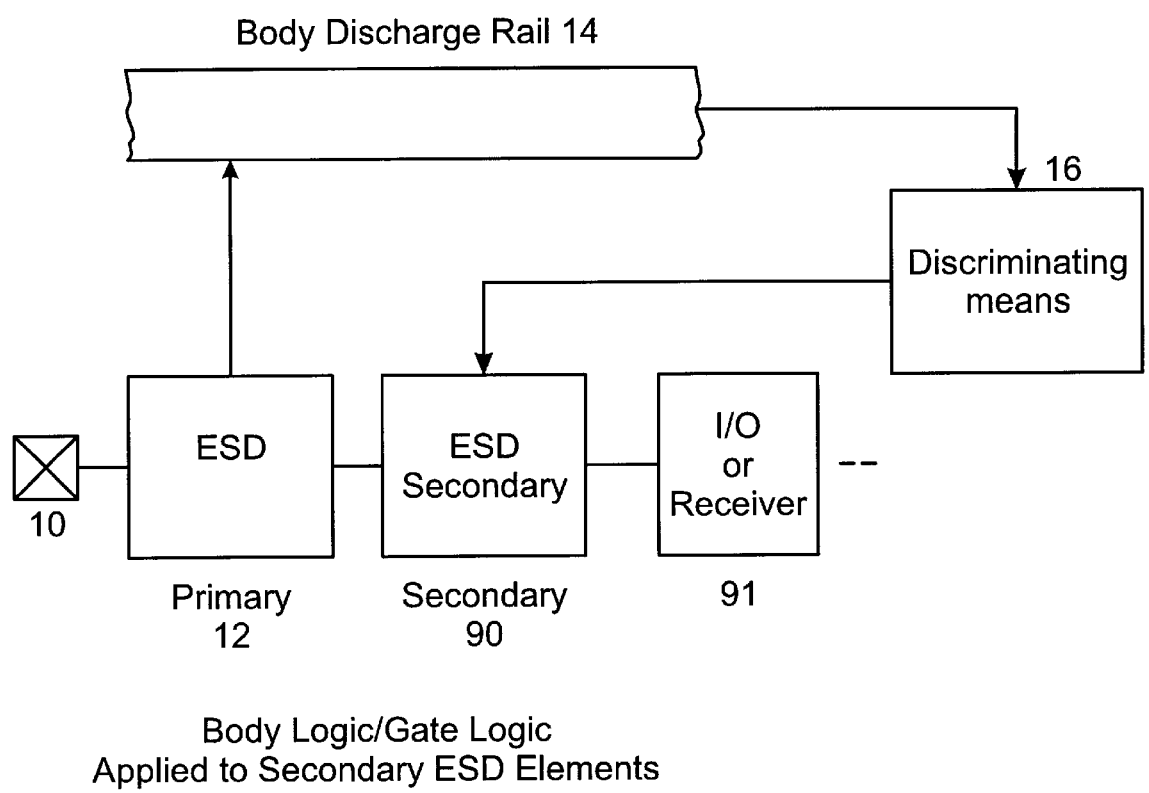
FIG. 9 is a block diagram of another embodiment of the present invention.

Another instance in which it may be advantageous to change the threshold voltage by biasing a body of a transistor is when a secondary ESD protection circuit is provided in addition to the primary ESD protection circuit. FIG. 9 illustrates in a block diagram a circuit having both primary 12 and secondary 90 ESD protection circuits for protecting the I/O or receiver 91. The pad 10 is connected to the primary ESD protection circuit 12 which, in turn, is connected to the rail 14. The rail 14 could also simply be a node. The discriminating means 16 is connected to the rail 14, or node, and when an ESD pulse occurs, supplies a signal to the secondary ESD secondary protection circuit 90.

Figure 10:
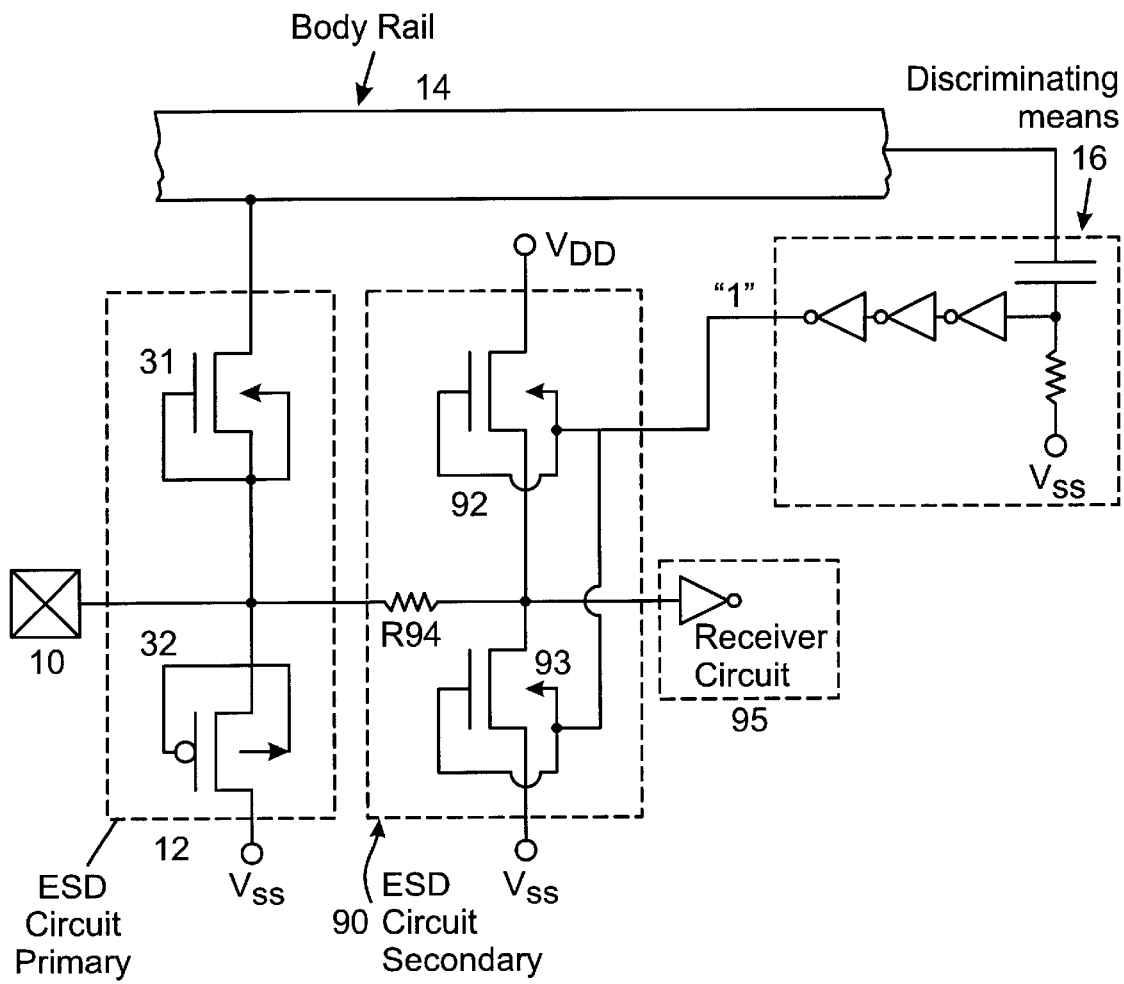
FIG. 10 is a schematic diagram of a specific form of the embodiment of FIG. 9.

FIG. 10 illustrates a specific form and the operation of the embodiment of FIG. 9. The primary ESD protection circuit 12 is shown as a n-channel body gate-coupled SOI diode 31 connected between pad 10 and rail 14 and a p-channel body gate-coupled SOI diode 32 connected between pad 10 and ground. In this instance, the rail 14 is an SOI body rail. The secondary ESD protection circuit 90 is shown as two DTMOS n-channel transistors 92, 93. The primary 12 and secondary ESD protection circuits 90 may or may not be of the same type. An optional resistor 94 is shown between the primary and secondary ESD protection circuits.

When an ESD pulse occurs on pad 10, the current is conducted via the ESD protection circuit 12 to rail 14. The discriminating means 16 determines that an ESD pulse has occurred and sends a signal to preferably both the body and gate of transistors 92, 93 comprising the secondary ESD protection circuit 90. The secondary ESD protection circuit 90 is shown as two n-channel SOI double diodes 92, 93, however any body biased configuration could be used. The "hi" signal applied to the bodies and gates of DTMOS n-channel transistors 92, 93 comprising the secondary ESD protection circuit 90 facilitates the turn-on of the transistors, providing better protection for the receiver 95.

Figure 11:
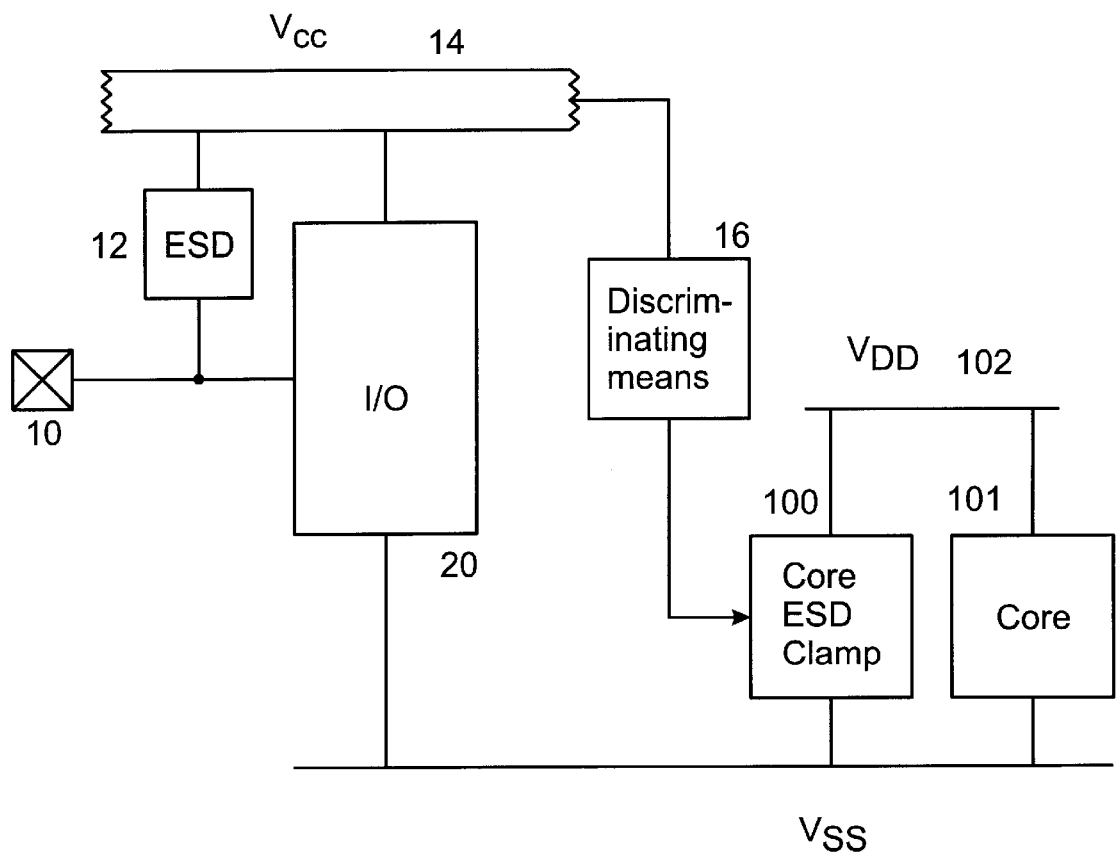
FIG. 11 is a block diagram of another embodiment of the present invention.

Furthermore, the concept of the present invention is not limited to drivers receivers, or I/O networks. It can also be applied to internal networks of the integrated circuit, for example a circuit having multiple power supplies. FIG. 11 shows an embodiment with a Vcc first power rail 14 and a Vdd second power rail 102 for the internal core power. The pad 10, ESD protection circuit 12, first rail 14 and I/O buffer or, as shown in the figure, body bias circuit 20 are connected as in the above-described embodiments. The discriminating means 16 is connected to first power rail 14. Core ESD clamp 100 and core 101 are connected in parallel between second power rail 102 and ground or the substrate Vss. When an ESD pulse occurs, discriminating means 16 supplies a signal to the core ESD clamp 100.

Figure 12:
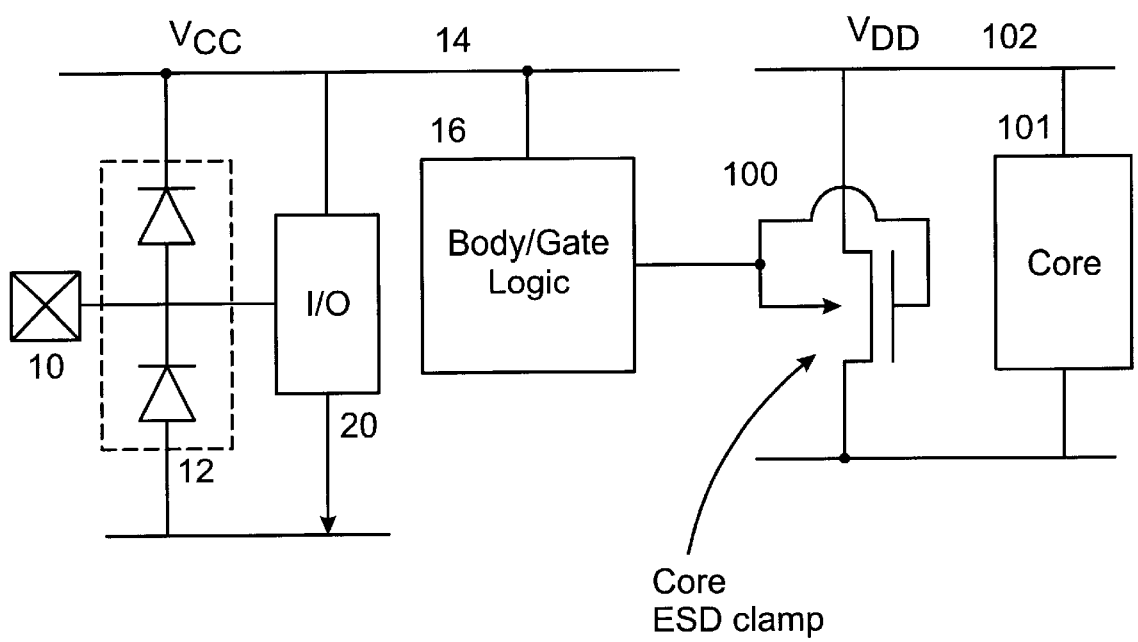
FIG. 12 is a schematic diagram of a specific form of the embodiment of FIG. 11.

FIG. 12 illustrates a specific embodiment of this aspect of the invention. Here ESD protection circuit 12 is shown as a pair of diodes, however, as mentioned above, any ESD protection circuit may be used. Core ESD clamp 100 as shown is a body and gate-coupled n-channel transistor. When an ESD pulse occurs on pad 10, the current is transmitted to first power rail 14 via ESD protection circuit 12. The discriminating means 16 then determines that an ESD pulse has occurred and supplies a signal to the body and gate of core ESD clamp 100 turning it on.

Accordingly, a method and apparatus for handling an ESD pulse which occurs in an SOI integrated circuit has been provided. The present invention allows an ESD pulse to be used to bias a body bias circuit, for example, the body and/or gate of a transistor, in I/O circuits, in internal circuits or wherever advantage can be gained. Although the method and apparatus of the specific embodiments of the present invention described above concentrate on positive pulses and apply a "hi" signal to n-channel transistors, the invention is equally applicable to negative pulses and to altering the threshold voltage of p-channel devices.

While a preferred embodiment of the invention has been described above, since variations in the invention will be apparent to those skilled in the art, the invention should not be construed as limited to the specific embodiments described above. For example, the specific construction of the body bias circuit, including the drivers, receivers and ESD elements, can be varied and the rail can be substituted with a node without departing from the basic concept of the invention.

What is claimed is:

1. A silicon-on-insulator (SOI) MOSFET body bias circuit comprising:
   a pad subject to an electrostatic discharge (ESD) pulse;
   frequency dependent discriminating means coupled to said pad for generating a signal when said ESD pulse occurs; and
   said MOSFET body bias circuit having its body biased by said signal from said discriminating means.

2. The circuit of 1 wherein said body bias circuit is an ESD network.

3. The circuit of claim 1 further comprising an ESD protection circuit coupled in between said pad and said discriminating means.

4. The circuit of claim 1 wherein the discriminating means is an RC filter.

5. A silicon-on-insulator (SOI) MOSFET body bias circuit comprising:
   a pad subject to an electrostatic discharge (ESD) pulse;
   frequency dependent discriminating means coupled to said pad for determining when said ESD pulse has occurred and for generating a signal in response thereto; and
   at least one SOI MOSFET transistor receiving said signal from said discriminating means to bias a body of said SOI MOSFET transistor when said ESD pulse occurs.

6. The circuit of claim 5 further comprising an ESD protection circuit coupled in between said pad and said discriminating means.

7. The circuit of claim 5 wherein said body of said SOI-MOSFET transistor is coupled to a gate of said at least one SOI MOSFET transistor.

8. The circuit of claim 7 further comprising a logic control circuit connected in between said discriminating means and said body of said at least one SOI MOSFET transistor.

9. The circuit of claim 6 further comprising a node between said ESD protection circuit and said pad;
   an I/O buffer connected to said node;
   said body bias circuit comprising ESD elements connected to said node; and
   a logic control circuit connected to said I/O buffer and said ESD elements.

10. The circuit of claim 9 wherein said logic control circuit comprises a first pre-drive circuit connected to said buffer and a second pre-drive circuit connected to said ESD elements.

11. The circuit of claim 10 wherein said ESD elements comprise a p-channel transistor connected between said node and a power supply and a n-channel transistor connected between said node and ground, a gate of each said transistor connected to said second pre-drive circuit and a body of each said transistor connected to said discriminating means.

12. The circuit of claim 6 wherein said body bias circuit comprises receiver circuitry.

13. The circuit of claim 12 wherein said receiver circuitry comprises a n-channel pass transistor having its body connected to said discriminating means and a n-channel transistor clamped to ground and having its body connected to said discriminating means.

14. The circuit of claim 12 wherein said receiver circuitry comprises at least one body biased transistor.

15. The circuit of claim 6 further comprising a rail coupled in between said ESD protection circuit and said discriminating means.

16. The circuit of claim 15 wherein said rail is a power supply rail.

17. The circuit of claim 15 wherein said rail is a body discharge rail.

18. The circuit of claim 15 wherein said SOI MOSFET body bias circuit is a driver.

19. The circuit of claim 18 wherein said driver is also coupled between said rail and ground.

20. The circuit of claim 18 further comprising a node between said pad and said ESD protection circuit, said driver comprising an p-channel transistor connected between said node and said rail and an n-channel transistor connected between said node and ground, each of said transistors having at least a body biased by said discriminating means.

21. The circuit of claim 20 wherein a gate of each said transistor is coupled to each said body and further comprising a logic control circuit connected between said gate and said discriminating means.

22. The circuit of claim 15 wherein said body bias circuit is a secondary ESD protection circuit connected to said ESD protection circuit and said discriminating means.

23. The circuit of claim 22 wherein said rail is a body discharge rail and said secondary ESD protection circuit is also connected to a circuit sensitive to an ESD event.

24. An SOI MOSFET body bias circuit comprising:
   a pad;
   at least one device sensitive to an over voltage event coupled to said pad;
   a node between said pad and said at least one device;
   an ESD protection network coupled between said node and a first power rail;
   discriminating means connected to said first power rail for determining when an ESD pulse has occurred and for sending a signal to at least a body of a body biased core clamp when said ESD pulse occurs, said core clamp connected between a second power rail and ground; and
   a core connected in parallel with said core clamp.

25. The circuit of claim 24 wherein said core clamp is a body and gate coupled n-channel transistor.

26. A method of using an ESD pulse occurring in an SOI MOSFET body bias circuit, said method comprising:
   conducting current from a pad of said circuit to a frequency dependent discriminating means;
   determining with said frequency dependent discriminating means when said ESD pulse occurs; and
   applying a signal from said frequency dependent discriminating means to at least a body of an SOI MOSFET transistor when said ESD pulse occurs.

27. The method of claim 26, wherein said SOI MOSFET transistor is part of a body bias circuit, further comprising:
   connecting a rail between said pad and said frequency dependent discriminating means;
   connecting said body bias circuit between said rail and ground;
   communicating said ESD pulse to said rail;
   changing a voltage threshold of said body bias circuit when said ESD pulse occurs to turn on said body bias circuit; and
   discharging said ESD pulse from said rail through said body bias circuit to ground.

28. A method of using an ESD pulse in an SOI MOSFET body bias circuit, said method comprising the steps of:
   conducting an over voltage from a pad of said circuit to a frequency dependent discriminating means;
   passing said over voltage through said discriminating means; and
   using said over voltage to change a threshold voltage of at least one transistor of said circuit.

* * * * *